United States Patent
Pey et al.

[11] Patent Number: 6,025,267
[45] Date of Patent: Feb. 15, 2000

[54] SILICON NITRIDE—TEOS OXIDE, SALICIDE BLOCKING LAYER FOR DEEP SUB-MICRON DEVICES

[75] Inventors: Kin-Leong Pey; Soh-Yun Siah; Yong-Meng Lee, all of Singapore, Singapore

[73] Assignee: Chartered Semiconductor Manufacturing, Ltd., Singapore, Singapore

[21] Appl. No.: 09/115,724
[22] Filed: Jul. 15, 1998
[51] Int. Cl.[7] ................................................. H01L 21/46
[52] U.S. Cl. .......................... 438/656; 438/299; 438/303; 438/655
[58] Field of Search ..................................... 438/656, 655, 438/657, 663–664, 299, 301–307, 294, 296

[56] References Cited

U.S. PATENT DOCUMENTS

| | | | |
|---|---|---|---|
| 5,573,980 | 11/1996 | Yoo | 437/200 |
| 5,665,646 | 9/1997 | Kitano | 438/592 |
| 5,756,391 | 5/1998 | Tsuchiaki | 438/592 |
| 5,786,249 | 7/1998 | Dennison | 438/241 |
| 5,935,875 | 8/1999 | Lee | 438/737 |

*Primary Examiner*—Charles Bowers
*Assistant Examiner*—Thanh Nguyen
*Attorney, Agent, or Firm*—George O. Saile; Rosemary L.S. Pike

[57] ABSTRACT

A method for forming self-aligned, metal silicide, (salicide), layers, on polysilicon gate structures, and on source/drain regions, located in a first region of a semiconductor substrate, while avoiding the salicide formation, on polysilicon gate structures, and on source/drain regions, located in a second region of a semiconductor substrate, has been developed. A composite insulator shape, comprising an overlying silicon nitride layer, and an underlying TEOS deposited, silicon oxide layer, is used to block polysilicon, as well as silicon regions, in the second region of the semiconductor substrate, from salicide formation. Unwanted silicon oxide spacers, created on the sides of polysilicon gate structures, during the patterning of the composite insulator shape, is selectively removed using dilute hydrofluoric acid solutions.

27 Claims, 4 Drawing Sheets

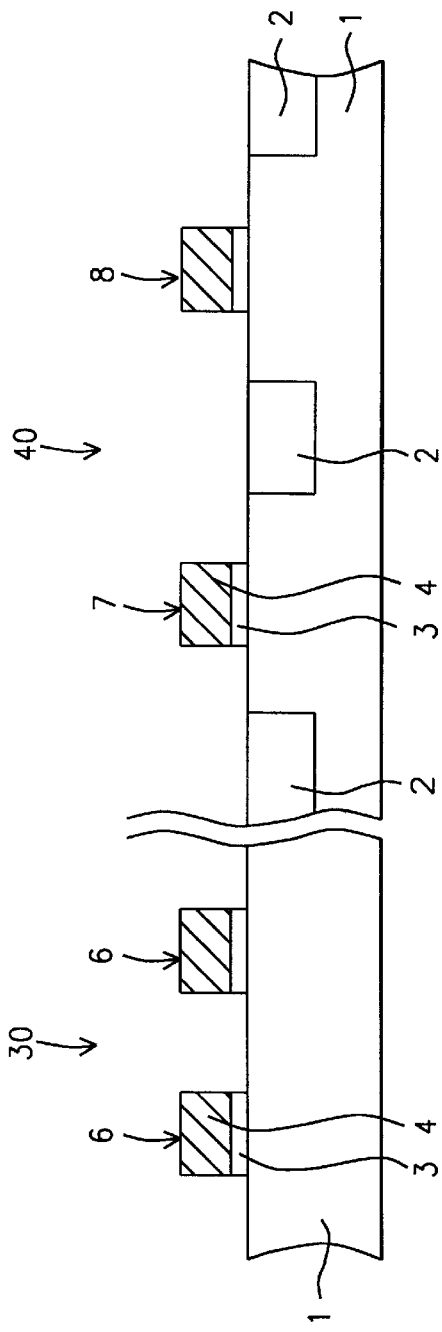
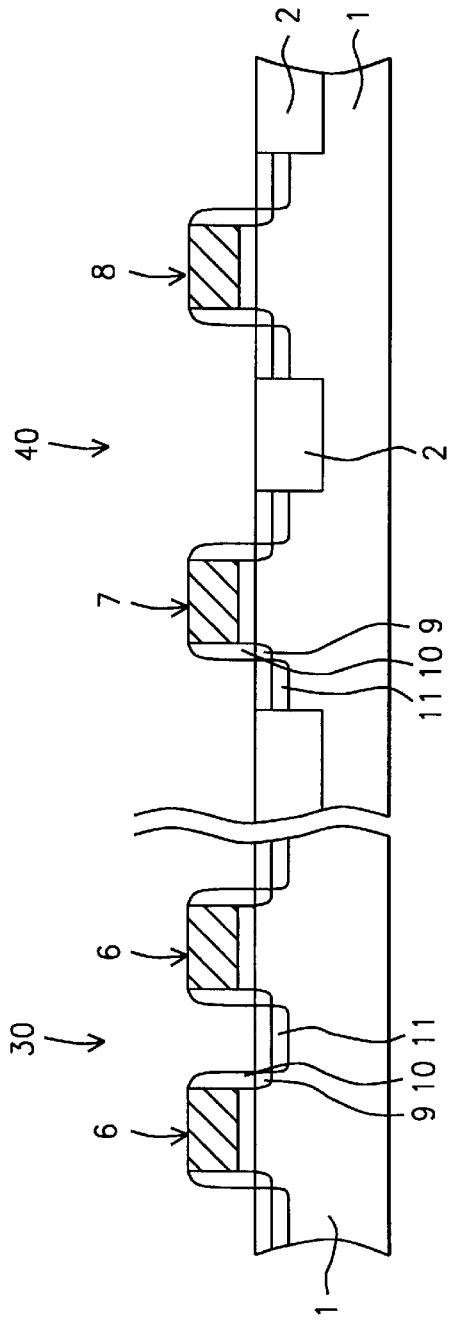
FIG. 1
FIG. 2

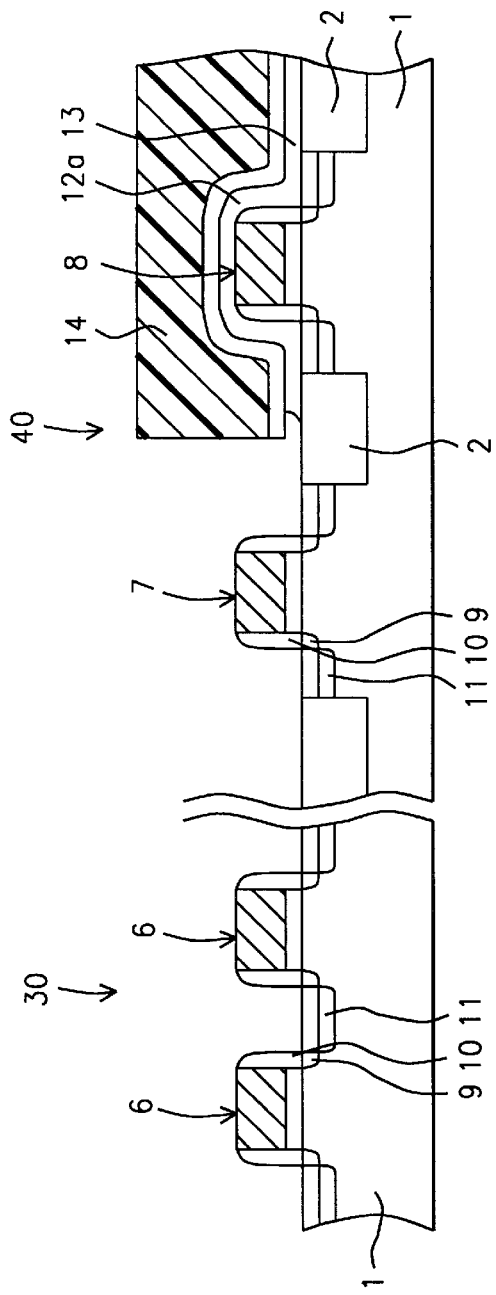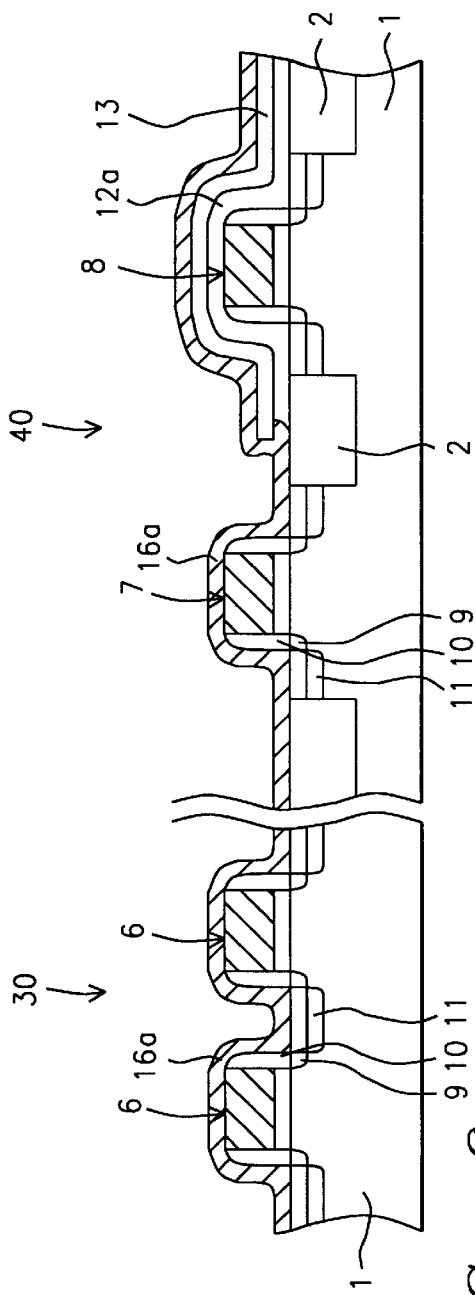

SILICON NITRIDE— TEOS OXIDE, SALICIDE BLOCKING LAYER FOR DEEP SUB-MICRON DEVICES

BACKGROUND OF THE INVENTION (1) Field of the Invention

The present invention relates to a process used to fabricate semiconductor devices, and more specifically to a process used to form salicide, (Self-ALigned metal siLICIDE), layers, only on specific regions of a semiconductor substrate.

(2) Description of the Prior Art

Metal oxide semiconductor field effect transistors, (MOSFET), devices can be fabricated using low resistance, polysilicon word lines, for logic applications, while other applications, such as memory devices, or electro-static discharge, (ESD), protection circuits, are usually fabricated using higher resistance, polysilicon word lines. For cases in which both memory and logic, MOSFET devices, or complimentary metal oxide semiconductor, (CMOS), devices, are used on a single semiconductor chip, low sheet resistance is needed for the polysilicon word line and for the source/drain regions, while higher sheet resistances are needed for the memory components. The use of salicide layers, formed only on the polysilicon and silicon regions, of devices needing lower sheet resistance, has been used to fabricate the higher performing devices, while other regions of the semiconductor chip, not requiring the lower sheet resistance, have been masked from the salicide process, thus resulting in the desired higher sheet resistance components.

The masking of the higher sheet resistance devices, during the process sequence used to form salicide layers on the devices requiring low sheet resistance regions, is usually accomplished using a silicon oxide layer. The metal layer used as a component of the salicide layer, overlying the masking silicon oxide layer, remains unreacted during an anneal cycle that is used to convert the same metal layer to a metal silicide layer, on the exposed polysilicon or silicon regions, of the devices requiring lower sheet resistance. Removal of unreacted metal, from the masking silicon oxide layer, and removal of the masking silicon oxide layer, result in polysilicon and source/drain regions, free of salicide layers, while unmasked counterparts, exhibit the desired, low resistance salicide layers on the polysilicon and source/drain regions, of high performing CMOS logic devices.

Several aspects of the use of silicon oxide layers, in regards to salicide blocking or masking functions, can however result in deleterious structural or device phenomena. First, an anisotropic reactive ion etching, (RIE), procedure used to remove the masking silicon oxide layer, in a first region of the semiconductor substrate, exposing polysilicon and silicon regions to a subsequent salicide layer, can result in the formation of an additional silicon oxide spacer, overlying an existing insulator spacer, located on the sides of the polysilicon word lines, in the first region of the semiconductor substrate. The additional silicon oxide spacer, decreases the design space between polysilicon word lines, and when using designs with sub-micron dimensions, the decreased space can result in the complete blockage of a source/drain region, located between polysilicon word lines, thus not allowing the incorporation of an overlying, low resistance salicide layer. Secondly, the silicon oxide layer, used as a mask for salicide formation, is obtained using low pressure chemical vapor deposition, (LPCVD), or plasma enhanced chemical vapor deposition, (PECVD), procedures, each using tetraethylorthosilicate, (TEOS), as a source. Undensified TEOS oxide layers have a high removal rate in dilute hydrofluoric, (DHF), or buffered hydrofluoric, (BHF), acid solutions. Therefore a BHF or a DHF, pre-clean procedure, performed to remove native oxide from the surface of the polysilicon and silicon regions being readied for salicide formation, results in large, and uncontrollable, thickness decreases, for the TEOS oxide mask that is used to block salicide formation, and therefore may not protect against salicide formation. Densification of the TEOS oxide layer, alleviating the rapid removal rate, during pre-clean procedures, would however adversely influence the thermal budget used for the sub-micron devices.

This invention will describe a composite insulator shape, comprised of a thin silicon nitride layer, overlying a thin TEOS oxide layer, used to block specific regions of a semiconductor substrate, from salicide formation. The composite insulator shape is anisotropically removed from the regions of the semiconductor substrate being readied for salicide formation, however after removal of the masking photoresist shape, which is used to maintain the composite insulator layer in regions not designed for salicide formation, a DHF, BHF, or a wet HF spray is performed to remove the additional TEOS oxide spacer, formed during the anisotropic RIE procedure. The thin nitride layer, of the composite insulator shape, not only remains as a blocking layer during removal of the additional TEOS oxide spacer, but also offers protection from subsequent BHF or DHF, preclean procedures, used prior to metal deposition, or protection from a silicon ion implantation procedure, used for amorphization of source/drain regions, allowing these source/drain regions to remain shallow. Prior art, such as Yoo et al, in U.S. Pat. No. 5,573,980, describe a salicide process, however the use of the novel salicide blocking, composite insulator shape, featured in the present invention, is not described in that prior art.

SUMMARY OF THE INVENTION

It is an object of this invention to fabricate a first group of transfer gate transistors, in a second region of a semiconductor substrate, using a salicide layer on polysilicon word lines, and on source/drain regions, while simultaneously fabricating a second group of transfer gate transistors, in a first region of a semiconductor substrate, without using a salicide layer for the polysilicon word lines, or for source/drain regions.

It is another object of this invention to use a patterned composite insulator layer, comprised of a silicon nitride layer, on a silicon oxide layer, deposited using TEOS as a source, to block the salicide formation, in the first region of a semiconductor substrate.

It is yet another object of this invention, to remove a TEOS oxide spacer, from the sides of polysilicon word lines, in a second region of a semiconductor substrate, formed during an anisotropic RIE patterning of the composite insulator layer, using a wet DHF, or a DHF spray, procedure.

In accordance with the present invention a method for using a patterned composite insulator layer, to allow regions of a semiconductor substrate to be protected from salicide formation, has been developed. Transfer gate transistors, comprising polysilicon gate structures on an underlying gate insulator layer, silicon nitride spacers on the sides of the polysilicon gate structures, and lightly doped, and heavily doped, source/drain regions, are formed in a first region, and in a second region, of a semiconductor substrate. A composite insulator layer, comprising an overlying silicon nitride layer, and an underlying TEOS deposited, silicon oxide layer, is deposited. A composite insulator shape is then formed via removal of the composite insulator layer from a second region of the semiconductor substrate, using anisotropic RIE procedures, exposing a second group of transfer gate transistors, in the second region of the semiconductor substrate, and creating a TEOS oxide spacer, on the silicon nitride spacers, located on the sides of the polysilicon gate structures. A first group of transfer gate transistors, located in a first region of the semiconductor substrate, remain protected by the overlying composite insulator shape. A dilute hydrofluoric wet etch, or an acid spray is used to remove the TEOS oxide spacers, from the sides of the polysilicon gate structures, in the second region of the semiconductor substrate, while the first group of transfer gate transistors remain protected by the overlying composite insulator shape. A silicon ion implantation procedure is applied to prepare the surface of source/drain regions, located in the second region of the semiconductor substrate, for subsequent salicide formation. A metal is deposited, followed by an anneal cycle converting the metal to a salicide layer, in regions in which the metal overlaid exposed polysilicon, and source/drain regions, in the second region of the semiconductor substrate. Unreacted metal, located overlying the composite insulator shape, in a first region of the semiconductor substrate, and also located on the silicon nitride spacers, on the sides of the polysilicon gate structures, in the second region of the semiconductor substrate, are selectively removed using wet acid procedures, leaving metal silicide, or salicide layers, located only on the polysilicon gate structures, and on the source/drain regions, in the second region of the semiconductor substrate. The composite insulator shape, overlying transfer gate transistors, in a first region of the semiconductor substrate, is then removed.

BRIEF DESCRIPTION OF THE DRAWINGS

The object and other advantages of this invention are best described in the preferred embodiments with reference to the attached drawings that include:

FIGS. 1–7, which schematically, in cross-sectional style, show the key stages of fabrication used to simultaneously form devices with salicide layers, while protecting, or blocking other devices from salicide formation, via use of a composite insulator shape.

DESCRIPTION OF THE PREFERRED EMBODIMENTS

Figure 3:
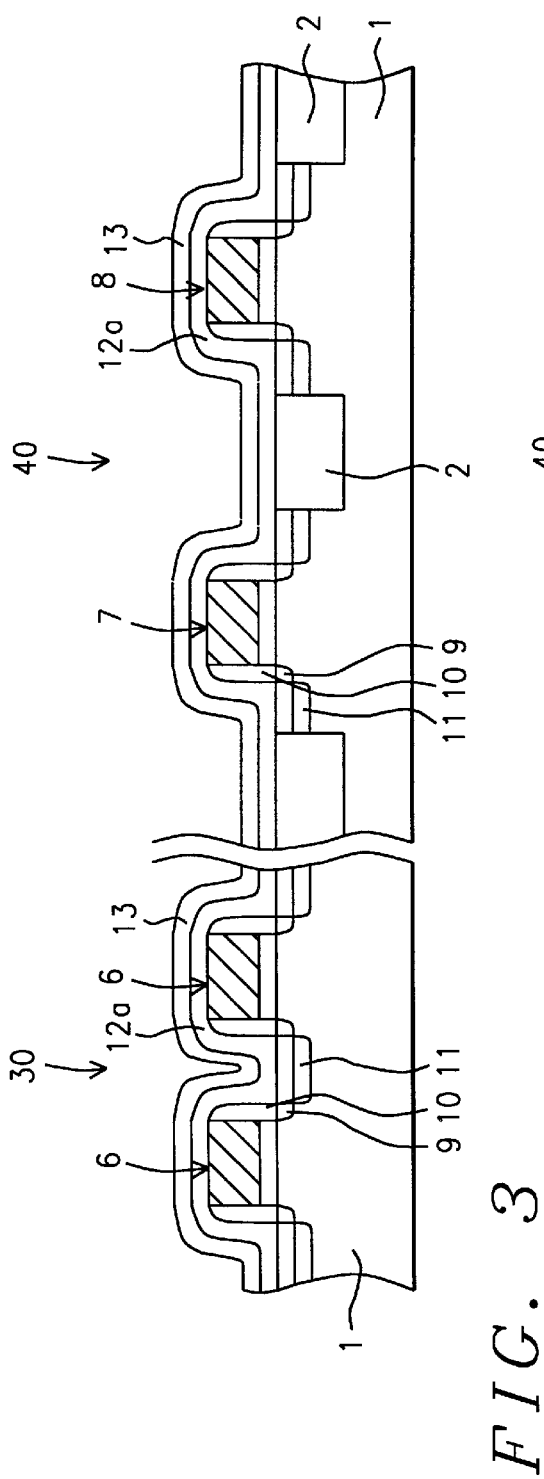

The process for forming, and using, a composite insulator shape, to prevent salicide formation on polysilicon and silicon surfaces, located in a first area of a semiconductor substrate, while salicide layers are formed on exposed polysilicon and silicon surfaces, located in a second area of a semiconductor substrate, will now be described in detail. The transfer gate transistors, used in this description, will be N channel, type, MOSFET devices, however this invention can be used with P channel, MOSFET devices, or CMOS type devices.

Referring to FIG. 1, a P type, semiconductor substrate 1, comprised of single crystalline silicon, featuring a <100> crystallographic orientation, is used. Region 30, will be used to illustrate this invention in which a space between polysilicon gate structures, or word lines, is narrow, in the sub-micron range of about 0.35 uM, for a 0.25 uM CMOS technology. The process for forming salicide layers for higher performance, logic devices, while masking, or not forming salicide layers, for lower performance memory devices, or for devices used for ESD circuits, via use of a patterned, composite insulator layer, will be illustrated using region 40, of semiconductor substrate 1.

Shallow trench isolation, (STI), regions 2, are formed in region 40, and schematically shown in FIG. 1. STI regions 2, are formed by initially creating a shallow trench, between about 3000 to 4000 Angstroms in depth, in semiconductor substrate 1, via conventional photolithographic and anisotropic RIE procedures, using $Cl_2$ as an etchant. After removal of the photoresist shape, used as a mask for shallow trench definition, via plasma oxygen ashing and careful wet cleans, a silicon oxide layer is deposited, using LPCVD or PECVD procedures, at a thickness between about 6500 to 7500 Angstroms, using TEOS as a source and completely filling the shallow trench. Removal of the silicon oxide layer from the top surface of semiconductor substrate 1, is accomplished using a chemical mechanical polishing procedure, or using a selective RIE procedure, using $CHF_3$ as an etchant, resulting in STI regions 2. A gate insulator layer 3, comprising silicon dioxide, is thermally grown in an oxygen—steam ambient, to a thickness between about 30 to 50 Angstroms. Next a polysilicon layer 4, is deposited, via LPCVD procedures, to a thickness between about 1800 to 250 Angstroms. Polysilicon layer 4, can be doped in situ, during deposition, via the addition of arsine, or phosphine, to a silane ambient, or the polysilicon layer can be deposited intrinsically and then doped via ion implantation of arsenic or phosphorous ions. Conventional photolithographic and anisotropic RIE procedures, using $Cl_2$ as an etchant, are used to create polysilicon gate structures, or word lines 6, in region 30, while polysilicon gate structure, or word line 7, and polysilicon gate structure, or word line 8, are formed in region 40, of semiconductor substrate 1. The photoresist shape, used for patterning of the polysilicon gate structures, is removed using plasma oxygen ashing and careful wet cleans. The wet clean procedure, also removed regions of gate insulator layer 3, not covered by the polysilicon gate structures. The result of these process steps is schematically shown in FIG. 1.

Lightly doped source/drain regions 9, shown schematically in FIG. 2, are next formed in regions of semiconductor substrate 1, not covered by STI regions 2, or by the polysilicon gate structure, via ion implantation of arsenic or phosphorous ions, at an energy between about 18 to 25 KeV, at a dose between about 3E14 to 6E14 atoms/cm$^2$. A silicon oxide layer is next deposited, (not shown in the drawings), via LPCVD procedures, using tetraethylorthosilicate, (TEOS), as a source, at a thickness of about 150 Angstroms, followed the deposition of a silicon nitride layer, via LPCVD or PECVD procedures, to a thickness between about 1000 to 1300 Angstroms. An anisotropic RIE procedure, using $SF_6$—HBr—$O_2$ as an etchant, is used to create silicon nitride spacers 10, on the sides of all polysilicon gate structures. A first narrow space between polysilicon gate structures 6, in region 30, is between about 0.18 to 0.22 uM. Heavily doped source/drain regions 11, shown schematically in FIG. 2, are next formed in uncovered regions of semiconductor 1, via an ion implantation procedure, performed at an energy between about 50 to 70 KeV, at a dose between about 2E15 to 4E15 atoms/cm$^2$, using arsenic or phosphorous ions.

A layer of silicon oxide 12a, is deposited using LPCVD or PECVD procedures, to a thickness between about 150 to 250 Angstroms, using TEOS as a source, followed by the deposition of silicon nitride layer 13, obtained via LPCVD or PECVD procedures, at a thickness between about 100 to 300 Angstroms. This is illustrated schematically in FIG. 3. The composite insulator layer, comprising overlying silicon nitride layer 13, and underlying silicon oxide layer 12a, will be subsequently patterned to create the desired mask, needed for salicide blocking. Undensified silicon oxide layer, or TEOS oxide layer 12a, exhibits a large etch rate in HF type solutions, and therefore overlying silicon nitride layer 13, supplies protection for TEOS oxide layer 12a, during subsequent HF pre-clean procedures. TEOS oxide 12a, could be densified via anneal cycles, which would decrease the removal rate of the TEOS oxide layer, in HF type solutions, however the anneal cycle would result in the device sub-micron features, such as shallow source/drain regions, to be compromised.

Figure 4:
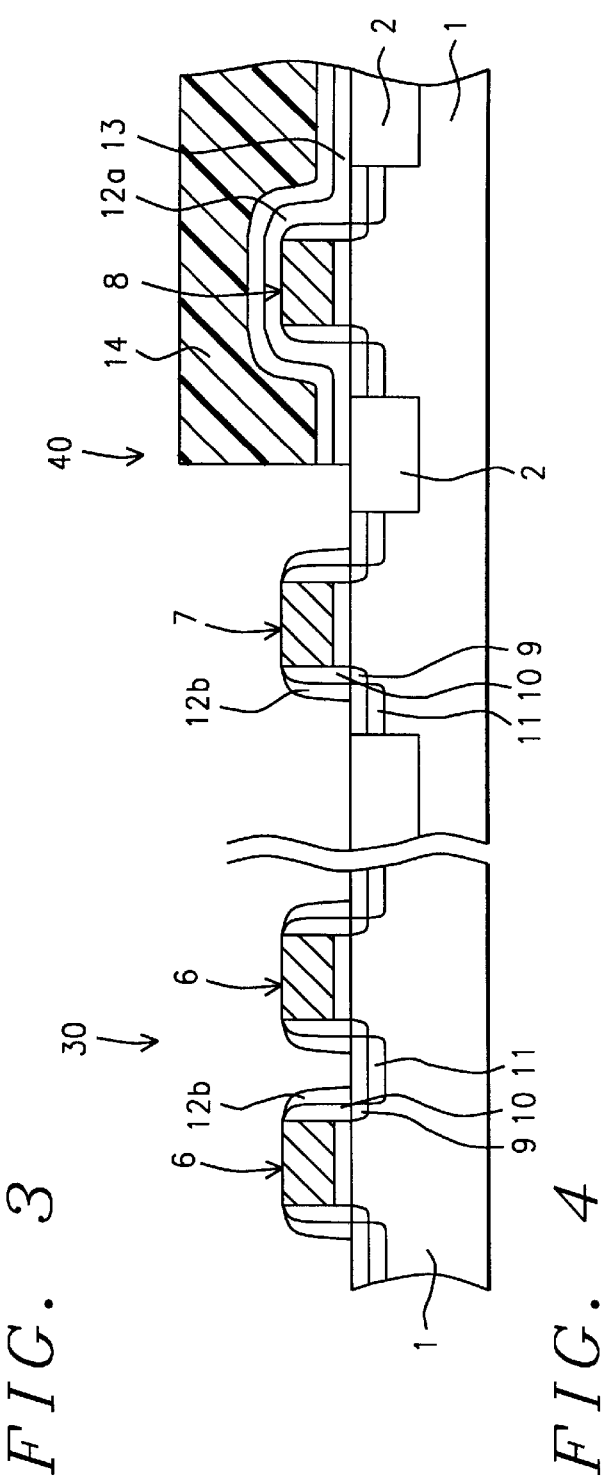

A photoresist shape 14, schematically shown in FIG. 4, is formed and used as mask, to remove the composite insulator layer from region 30, exposing the top surface of polysilicon gate structures 6, and the top surface of heavily doped source/drain region 11, located between polysilicon gate structures 6. Photoresist shape 14, also allows the removal of the composite insulator layer in an area of region 40, exposing the top surface of polysilicon gate structure 7, and the top surface of heavily doped source/drain region 11, located between polysilicon gate structure 7, and STI regions 2. The removal of the composite insulator layer, preparing specific regions polysilicon and silicon for subsequent salicide formation, is accomplished using RIE procedures. First, silicon nitride layer 13, is removed using an anisotropic RIE, using $SF_6$—HBr—$O_2$ as an etchant, this is followed by the removal of exposed TEOS oxide layer 12a, accomplished via an anisotropic RIE procedure, again using $SF_6$—HBr—$O_2$ as an etchant. The use of anisotropic RIE procedures, for removal of TEOS oxide layer 12a, removes all of the remaining silicon nitride layer 13, and results in the formation of TEOS oxide spacer 12b, formed on the sides of polysilicon gate structures 6, in region 30, and on the sides of polysilicon gate structure 7, in region 40. Referring to region 30, the first narrow space between polysilicon gate structures 6, is reduced to a second narrow space, between about 0.14 to 0.18 uM, as a result of the additional TEOS oxide spacers 12b. This reduction in the area between polysilicon gate structures, reduces the exposed area of the heavily doped source/drain region 11, located between polysilicon gate structures 6, and thus if not subsequently removed, will be blocked from a subsequent salicide formation, used to lower the resistance of heavily doped source/drain region 11. This is schematically shown in FIG. 4.

The removal of TEOS oxide spacers 12b, is next addressed, and shown schematically in FIG. 5. With photoresist shape 14, in place, a dilute hydrofluoric, (DHF), solution, between about 10 to 20 parts water, to one part HF, is used to selectively remove TEOS oxide spacers 12b, from the sides of polysilicon gate structures. Silicon nitride spacers 10, are not attacked by the DHF procedure, resulting in the area between polysilicon gate structures 6, being restored to the dimensions of the first narrow space, that existed prior to the TEOS oxide patterning procedure. A DHF, HF, or buffered HF spray, can also be used for selective removal of the undensified, TEOS oxide spacers. In addition the removal of TEOS oxide spacers 12b, was shown with photoresist shape 14, in place, however if desired photoresist shape 14, had been previously removed, silicon nitride layer 13, of the composite insulator shape, would have protected underlying TEOS oxide layer 12a, from the DHF procedure. Also shown schematically in FIG. 5, is the isotropic component of the DHF procedure, resulting in an undercut of underlying TEOS oxide layer 12a, component, of the composite insulator shape, in region 40.

After removal of photoresist shape 14, via plasma oxygen ashing and careful wet cleans, a silicon, ion implantation procedure, is used to prepare, or damage, the surfaces of exposed heavily doped source/drain regions 11, and the surfaces of polysilicon gate structures 6 and 7, resulting in enhancement of subsequent salicide formation, and the ability to maintain the depth of the sub-micron source/drain regions. A pre-metal clean, in a DHF or in a BHF solution, is used to remove native oxide from exposed surfaces of polysilicon or source/drain regions, followed by the deposition of a metal layer 16a, such as titanium, cobalt, nickel, or nickel alloy, shown schematically in FIG. 6, using R.F. sputtering procedures, to a thickness between about 100 to 400 Angstroms. Typically the metal layers are capped with a titanium nitride layer, between about 150 to 250 Angstroms in thickness. Silicon nitride layer 13, preserved the integrity of the blocking, composite insulator shape, during the metal pre-clean procedure, as well as offering additional masking during the silicon ion implantation procedure. If silicon nitride layer 13, were not a component of the blocking composite insulator shape, TEOS oxide layer 12a, may have been removed during pre-clean procedures, resulting in the deleterious formation of a subsequent salicide layer on polysilicon gate structure 8.

Figure 7:
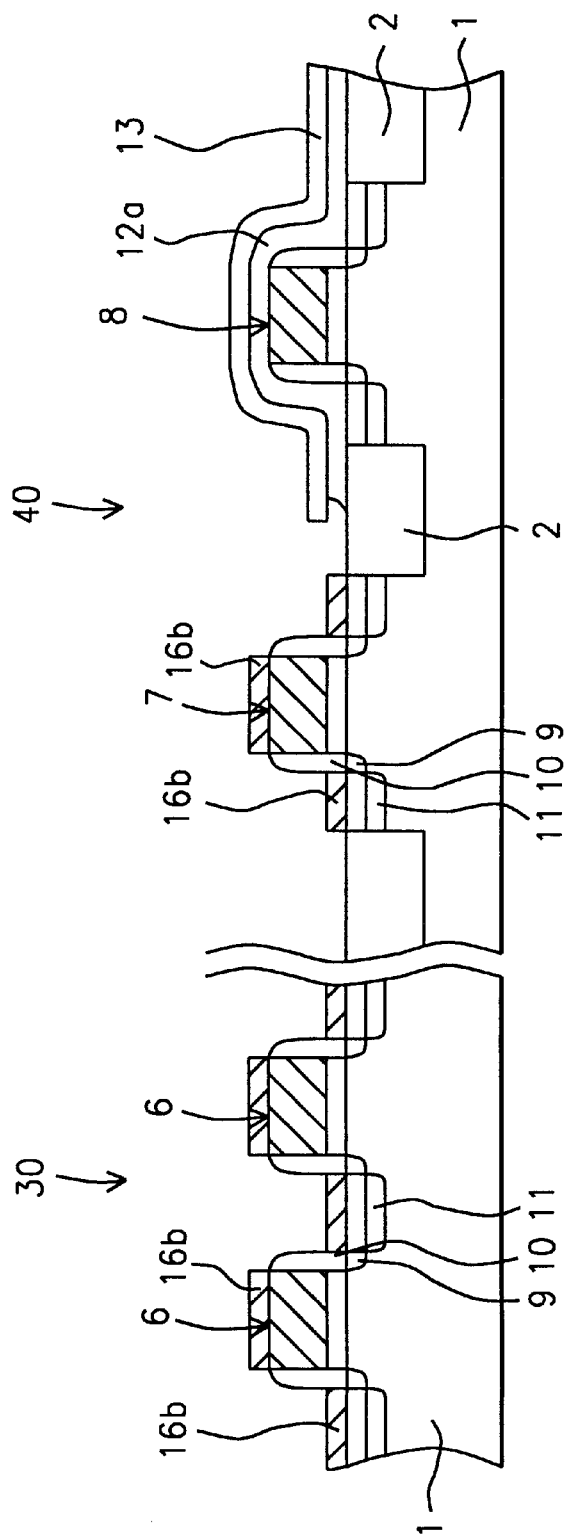

An anneal cycle, performed using a rapid thermal anneal, (RTA), procedure, or a conventional furnace procedure, is employed, at a temperature between about 700 to 750° C., in a nitrogen ambient, and is used to convert titanium layer 16a, to titanium silicide layer 16b, in regions where the metal layer 16a, overlaid exposed surfaces of polysilicon or source/drain regions. For cobalt, nickel, or nickel alloy layer 16a, an anneal temperature between about 500 to 600° C., is used, in a nitrogen ambient, to form cobalt silicide, nickel silicide, or nickel, (alloy), silicide layer 16b. Metal layer 16a, located overlying silicon nitride spacers 10, and located on silicon nitride layer 13, remains unreacted, and is selectively removed using a 1:1:5 solution of $NH_4OH$—$H_2O_2$—$H_2O$. A 1:1:5 solution of HCl—$H_2O_2$—$H_2O$, would be used to remove unreacted cobalt, nickel, or nickel alloy. A second anneal cycle is used to lower the resistance of the silicide layers. For the case of titanium silicide a second anneal, is performed at a temperature of about 850° C., for about 10 to 30 sec., while a second anneal, at a temperature of about 750° C., for about 10 to 30 sec., is used to reduce the resistance of cobalt silicide, nickel silicide, or nickel, (alloy), silicide layers. The result of this procedure, schematically shown in FIG. 7, is the selective salicide, or metal silicide formation, in areas not blocked with the composite insulator shape, comprised of silicon nitride layer 13, overlying TEOS oxide layer 12a. The result of these procedures, again shown schematically in FIG. 7, are that polysilicon gate structure 8, and heavily doped source/drain region 11, located between polysilicon gate structure 8, and STI regions 2, do not exhibit salicide layer 16b, while counterpart polysilicon gate structures 6, polysilicon gate structure 7, as well as the adjacent source/drain regions, have been overlaid with the low resistance, salicide, or metal silicide layer 16b.

While this invention has been particularly shown and described with reference to, the preferred embodiments thereof, it will be understood by those skilled in the art that various changes in form and details may be made without departing from the spirit and scope of this invention.

What is claimed is:

1. A method of blocking the formation of a metal silicide layer, on exposed silicon surfaces, in a first region of a semiconductor substrate, while allowing the formation of a metal silicide layer, on exposed silicon surfaces, in a second region of a semiconductor substrate, comprising the steps of:

forming shallow trench isolation regions, in said semiconductor substrate;

forming a gate insulator layer on said semiconductor substrate;

forming a first polysilicon gate structure, and a second polysilicon structure, on said gate insulator layer, in a second region of said semiconductor substrate;

forming a third polysilicon gate structure, on said gate insulator layer, in said second region of said semiconductor substrate, with said third polysilicon gate structure located between a first shallow trench isolation region, and a second shallow trench isolation region;

forming a fourth polysilicon gate structure, on said gate insulator layer, in said first region of said semiconductor substrate, with said fourth polysilicon gate structure located between said second shallow trench isolation region, and a third shallow trench isolation region;

forming lightly doped source/drain regions in areas of said semiconductor substrate, not covered by polysilicon gate structures, and not covered by said shallow trench isolation regions;

forming a first insulator spacer on the sides of said polysilicon gate structures, resulting in a first narrow space between said first polysilicon gate structure, and said second polysilicon gate structure;

forming heavily doped source/drain regions in an area of said semiconductor substrate, not covered by said polysilicon gate structures, not covered by said shallow trench isolation regions, and not covered by said first insulator spacers;

depositing an underlying masking insulator layer;

depositing an overlying masking insulator layer;

patterning of said overlying masking insulator layer, and of said underlying masking insulator layer, to create a composite insulator shape, overlying said first region of said semiconductor substrate, with the patterning procedure forming a second insulator spacer, comprising said underlying masking insulator layer, on said first insulator spacer, located on the sides of the polysilicon gate structures, in said second region of said semiconductor substrate, and with said second insulator spacer reducing said first narrow space between said first polysilicon gate structure, and said second polysilicon gate structure, to a second narrow space;

removing said second insulator spacer, from said first insulator spacer, located on the sides of the polysilicon gate structures, in said second region of said semiconductor substrate, resulting in reestablishment of said first narrow space, between said first polysilicon gate structure, and said second polysilicon gate structure;

performing a pre-clean procedure, to the exposed surfaces of the polysilicon gate structures, and exposed surfaces of the heavily doped source/drain region, located in said second region of said semiconductor substrate;

depositing a metal layer;

performing a first anneal procedure to form said metal silicide layer on the polysilicon gate structures, and on said heavily doped source drain regions, located in said second region of said semiconductor substrate, while leaving said metal layer, unreacted, on said first insulator spacer, on the sides of the polysilicon gate structures, located in said second region of said semiconductor substrate, and leaving said metal layer, unreacted, on the top surface of said composite insulator shape, in said first region of said semiconductor substrate;

removing unreacted, said metal layer; and performing a second anneal procedure to form a lower sheet resistance, metal silicide layer.

2. The method of claim 1, wherein said polysilicon gate structures are comprised from a polysilicon layer, obtained using LPCVD procedures, at a thickness between about 1800 to 2500 Angstroms, and with the polysilicon layer doped in situ, during deposition, via the addition of arsine, or phosphine, to a silane ambient, or with the polysilicon layer deposited intrinsically, and doped via an ion implantation procedure, using arsenic or phosphorous ions.

3. The method of claim 1, wherein said first insulator spacer, comprising a silicon nitride layer, obtained via deposition of a silicon nitride layer, using an LPCVD or a PECVD procedure, to a thickness between about 1000 to 1300 Angstroms, with said first insulator spacer formed via an anisotropic RIE procedure, applied to a said silicon nitride layer, using $SF_6$—HBr—$O_2$ as an etchant.

4. The method of claim 1, wherein said first narrow space, located between said first polysilicon gate structure, and said second polysilicon gate structure, both coated with said first insulator spacers, is between about 0.18 to 0.22 uM.

5. The method of claim 1, wherein said heavily doped source/drain regions are formed via ion implantation of arsenic or phosphorous, at an energy between about 50 to 70 KeV, at a dose between about 2E15 to 4E15 atoms/cm$^2$.

6. The method of claim 1, wherein said underlying masking layer is a silicon oxide layer, obtained using LPCVD or PECVD procedures, at a thickness between about 150 to 250 Angstroms, using TEOS as a source.

7. The method of claim 1, wherein said overlying masking layer is a silicon nitride layer, obtained using LPCVD or PECVD procedures, at a thickness between about 100 to 300 Angstroms.

8. The method of claim 1, wherein said composite insulator shape is formed via an anisotropic RIE procedure, applied to said overlying masking layer, using $SF_6$—HBr—$O_2$ as an etchant, and via an anisotropic RIE procedure, applied to said underlying masking layer, using $SF_6$—HBr—$O_2$ as an etchant.

9. The method of claim 1, wherein said second narrow space, located between said first polysilicon gate structure, and said second polysilicon gate structure, where both polysilicon gate structures are coated with said first insulator spacer, and with said second insulator spacer, is between about 0.14 to 0.18 uM.

10. The method of claim 1, wherein said second insulator spacer is removed using either a wet DHF solution, comprised between about 10 to 20 parts water, to one part HF, or removed via use of a DHF, HF or BHF, spray procedure.

11. The method of claim 1, wherein said metal layer is a titanium layer, or a cobalt layer, or a nickel layer, or a nickel alloy layer, deposited using R.F. sputtering procedures, to a thickness between about 100 to 400 Angstroms.

12. The method of claim 1, wherein said metal silicide layer, is a titanium silicide layer, or a cobalt silicide layer, or a nickel silicide layer, or a nickel alloy silicide layer, with the titanium silicide layer formed using an RTA procedure, or a conventional furnace procedure, at a temperature between about 700 to 750° C., while the cobalt silicide, nickel silicide, and nickel alloy silicide layers, are formed at a temperature between about 600 to 700° C.

13. The method of claim 1, wherein said metal layer, if titanium is removed using a 1:1:5 solution of $NH_4OH$—$H_2O_2$—$H_2O$, or if said metal layer is cobalt, nickel, or nickel alloy, is removed using a 1:1:5 solution of HCl—$H_2O_2$—$H_2O$.

14. The method of claim 1, wherein said second anneal procedure, used to reduce the resistance of said metal silicide layer, is performed at a temperature between about 750 to 850° C.

15. The method of using a composite insulator shape, comprising an overlying silicon nitride layer and an underlying silicon oxide layer, to mask the formation of a self-aligned, metal silicide layer, on polysilicon and silicon surfaces, located in a first region of a semiconductor substrate, while forming a metal silicide layer, on polysilicon and silicon surfaces, exposed in a second region of said semiconductor substrate, comprising the steps of:

forming silicon oxide filled, shallow trench regions, in said semiconductor substrate;

growing a silicon dioxide, gate insulator layer, on said semiconductor substrate;

forming a first polysilicon gate structure, and forming a second polysilicon gate structure, in said second region, of said semiconductor substrate;

forming a third polysilicon gate structure, in said second region, of said semiconductor substrate, located between a first silicon oxide filled shallow trench region, and a second silicon oxide filled shallow trench region;

forming a fourth polysilicon gate structure, in said first region of said semiconductor substrate, located between said second silicon oxide filled shallow trench region, and a third silicon oxide filled shallow trench region;

forming lightly doped source/drain regions, in regions of said semiconductor substrate, not covered by said polysilicon gate structures, and not covered by said silicon oxide filled shallow trench regions;

forming silicon nitride spacers on the sides of said polysilicon gate structures, creating a first narrow space between said first polysilicon gate structure and said second polysilicon gate structure;

forming heavily doped source/drain regions in regions of said semiconductor substrate not covered by said polysilicon gate structure, not covered by said silicon nitride spacers, and not covered by said silicon oxide filled, shallow trench regions;

depositing said underlying silicon oxide layer, of said composite insulator shape;

depositing said overlying silicon nitride layer, of said composite insulator shape;

patterning of said overlying silicon nitride layer, and of said underlying silicon oxide layer, to form said composite insulator shape, overlying said first region of said semiconductor substrate, and forming silicon oxide spacers, on underlying, said silicon nitride spacers, located on the sides of the polysilicon gate structures, in said second region of said semiconductor substrate, and creating a second narrow space, between said first polysilicon gate structure, and said second polysilicon gate structure;

selectively removing said silicon oxide spacer from underlying, said silicon nitride spacers, re-forming said first narrow space, located between said first polysilicon gate structure and said second polysilicon gate structure;

performing a silicon ion implantation procedure;

performing a wet pre-clean procedure;

depositing a metal layer;

performing a first anneal procedure to form said self-aligned, metal silicide layer, on the top surface of polysilicon gate structures, and on the top surface of heavily doped source/drain regions, exposed in said second region of said semiconductor substrate, while said metal layer remains unreacted on said silicon nitride spacer, located on the sides of the polysilicon gate structures, in said second region of said semiconductor substrate, and with said metal also remaining unreacted on said composite insulator shape, in said first region of said semiconductor substrate;

removing unreacted, said metal layer; and performing a second anneal procedure, to form a lower sheet resistance, metal silicide layer.

16. The method of claim 15, wherein said polysilicon gate structures are formed from a polysilicon layer, deposited using LPCVD procedures, at a thickness between about 1800 to 2500 Angstroms, and with said polysilicon gate structures formed via use of an anisotropic RIE procedure, applied to the polysilicon layer, using $Cl_2$ as an etchant.

17. The method of claim 15, wherein said silicon nitride spacers are formed from a silicon nitride layer, deposited using LPCVD or PECVD procedures, to a thickness between about 1000 to 1300 Angstroms, and patterned via an anisotropic RIE procedure, applied to the silicon n nitride layer, using $SF_6$—$HBr$—$O_2$ as an etchant.

18. The method of claim 15, wherein said first narrow space, located between said first polysilicon gate structure, and said second polysilicon gate structure, is between about 0.18 to 0.22 uM.

19. The method of claim 15, wherein said heavily doped source/drain regions, are formed via an ion implantation procedure, using arsenic or phosphorous ions, at an energy between about 50 to 70 KeV, and at a dose between about 2E15 to 4E15 atoms/$cm^2$.

20. The method of claim 15, wherein said underlying silicon oxide layer, of said composite insulator shape, is a TEOS oxide layer, deposited using LPCVD or PECVD procedures, to a thickness between about 100 to 300 Angstroms, using TEOS as a source.

21. The method of claim 15, wherein said overlying silicon nitride layer, of said composite insulator shape, is deposited using LPCVD or PECVD procedures, to a thickness between about 100 to 300 Angstroms.

22. The method of claim 15, wherein said silicon oxide spacers, are formed via an anisotropic RIE procedure, applied to said underlying silicon oxide layer, using $SF_6$—$HBr$—$O_2$ as an etchant.

23. The method of claim 15, wherein said second narrow space, between said first polysilicon gale structure, and said second polysilicon gate structure, is between about 0.14 to 0.18 uM.

24. The method of claim 15, wherein said silicon oxide spacers are selectively removed using a DHF solution, comprised of between about 10 to 20 parts water, to one part HF, or said silicon oxide spacers are selectively removed using a HF containing spray.

25. The method of claim 15, wherein said metal layer is a titanium layer, cobalt layer, a nickel layer, or a nickel alloy layer, obtained via R.F. sputtering procedures, to a thickness between about 100 to 400 Angstroms.

26. The method of claim 15, wherein said self-aligned metal silicide layer, is a titanium silicide layer, or a cobalt silicide layer, or a nickel silicide layer, or a nickel alloy silicide layer, obtained from reaction of said metal layer on exposed polysilicon, or on exposed silicon surfaces, using an RTA procedure, or conventional furnace annealing, at a temperature between about 500 to 750° C.

27. The method of claim 15, wherein said metal layer, if titanium is removed using 1:1:5 solution of $NH_4OH$—$H_2O_2$—$H_2O$, and if said metal layer is cobalt, nickel, or nickel alloy, is removed using a 1:1:5 solution of $HCl$—$H_2O_2$13 $H_2O$.

* * * * *